United States Patent
Dumas

(10) Patent No.: US 9,906,185 B2
(45) Date of Patent: Feb. 27, 2018

(54) METHOD FOR DETECTING A SHORT CIRCUIT IN A SYNCHRONOUS MACHINE FITTED WITH AN ANGULAR POSITION SENSOR

(71) Applicant: LOHR ELECTROMECANIQUE, Hagenbieten (FR)

(72) Inventor: Pierre Dumas, Strasbourg (FR)

(73) Assignee: LOHR ELECTROMECANIQUE, Hangenbieten (FR)

( * ) Notice: Subject to any disclaimer, the term of this patent is extended or adjusted under 35 U.S.C. 154(b) by 0 days.

(21) Appl. No.: 15/119,972

(22) PCT Filed: Feb. 16, 2015

(86) PCT No.: PCT/FR2015/050367
§ 371 (c)(1),
(2) Date: Aug. 18, 2016

(87) PCT Pub. No.: WO2015/124855
PCT Pub. Date: Aug. 27, 2015

(65) Prior Publication Data
US 2017/0070177 A1    Mar. 9, 2017

(30) Foreign Application Priority Data
Feb. 24, 2014   (FR) ...................... 14 51456

(51) Int. Cl.
*H02H 7/09*    (2006.01)
*H02P 7/00*    (2016.01)
(Continued)

(52) U.S. Cl.
CPC .......... *H02P 29/024* (2013.01); *G01R 31/343* (2013.01); *G01R 31/346* (2013.01);
(Continued)

(58) Field of Classification Search
CPC ...... H02K 15/03; H02K 1/276; H02K 1/2766; H02K 21/042; H02P 21/0089;
(Continued)

(56) References Cited

U.S. PATENT DOCUMENTS 4,412,290 A * 10/1983 Pannier ................... F02P 7/067
                                                              477/115
4,837,519 A *  6/1989 Lopetrone .............. G01R 27/18
                                                              324/528
(Continued)

FOREIGN PATENT DOCUMENTS

DE          3405225       8/1984
DE       102008059005     5/2010
(Continued)

OTHER PUBLICATIONS

International Search Report conducted in related application PCT/FR2015/050443, dated Apr. 14, 2016.
(Continued)

*Primary Examiner* — Paul Ip
(74) *Attorney, Agent, or Firm* — Meunier Carlin & Curfman LLC

(57) ABSTRACT

The invention relates to a method for detecting a short circuit between the phases of a polyphase synchronous machine (1) comprising a stator (2) and a rotor (3), said machine being fitted with at least one angular position sensor (1a) of the rotor (3), the rotor (3) comprising means for generating a magnetic induction provided to move said rotor around the stator (2), the angular position sensor (1a) comprising at least two magnetic induction measurement sensors (6), the induction measurement sensors (6) extending to an axial end (3a) of the rotor (3), facing and immediately adjacent to the axial edges (4a) of the means for generating a magnetic induction, characterized in that said method consists of: i1) using the values measured and supplied by the induction
(Continued)

measurement sensors, i2) calculating the gradient of the curve of the measured values as a function of time, i3) comparing the calculated gradient with a threshold value, Vs, and i4) if the calculated gradient is greater than or equal to the threshold value, Vs, generating a warning signal, S, using an electronic unit and, if this is not the case, returning to step i1).

18 Claims, 3 Drawing Sheets

(51) Int. Cl.
    *H02P 29/024*     (2016.01)
    *G01R 31/34*     (2006.01)
    *H02K 11/215*     (2016.01)
    *H02P 25/024*     (2016.01)

(52) U.S. Cl.
    CPC .......... *H02K 11/215* (2016.01); *H02P 25/024* (2016.02); *H02P 29/0241* (2016.02)

(58) Field of Classification Search
    CPC .......... H02P 21/02; H02P 21/06; H02P 21/10; H02P 23/0095; H02P 23/14; H02P 23/28; G01R 31/025; G01R 31/1227; G01R 31/343; G01R 13/01
    USPC .............. 318/400.02, 400.22, 432, 718, 720
    See application file for complete search history.

(56) References Cited

U.S. PATENT DOCUMENTS

| | | | | |
|---|---|---|---|---|
| 5,030,917 A * | 7/1991 | Kliman | ................ | G01R 31/343 324/545 |
| 6,097,129 A | 8/2000 | Furtwaengler et al. | | |
| 6,774,664 B2 * | 8/2004 | Godbersen | ............. | G01R 31/34 324/545 |
| 8,179,068 B2 * | 5/2012 | Yuuki | ................ | H02K 1/2766 318/432 |
| 8,552,678 B2 * | 10/2013 | Yuuki | ................ | H02K 1/2766 318/432 |
| 8,654,487 B2 * | 2/2014 | Mikani | ................ | H02H 1/0015 361/42 |
| 8,884,576 B2 * | 11/2014 | Yuuki | ................ | H02K 1/2766 318/432 |
| 2002/0175674 A1 | 11/2002 | Raftari | | |
| 2009/0261774 A1 * | 10/2009 | Yuuki | ................ | H02K 1/2766 318/720 |
| 2012/0068653 A1 | 3/2012 | Horiuchi et al. | | |
| 2012/0181970 A1 * | 7/2012 | Yuuki | ................ | H02K 1/2766 318/716 |
| 2012/0229939 A1 * | 9/2012 | Mikani | ................ | H02H 1/0015 361/55 |
| 2013/0033215 A1 | 2/2013 | Krishnamurthy et al. | | |
| 2013/0334991 A1 * | 12/2013 | Yuuki | ................ | H02K 1/2766 318/400.02 |
| 2014/0176152 A1 * | 6/2014 | Wolbank | ............. | G01R 31/343 324/510 |
| 2014/0184133 A1 * | 7/2014 | Yuuki | ................ | H02K 1/2766 318/718 |
| 2015/0192632 A1 * | 7/2015 | Crosman, III | ....... | G01R 31/025 324/510 |

FOREIGN PATENT DOCUMENTS

| | | |
|---|---|---|
| DE | 102011056252 | 6/2013 |
| EP | 0552991 | 7/1993 |
| EP | 1758230 | 2/2007 |
| FR | 2680920 | 3/1993 |
| FR | 2987439 | 8/2013 |
| GB | 2483177 | 2/2012 |

OTHER PUBLICATIONS

International Search Report conducted in related application PCT/FR2015/050414, dated Apr. 7, 2016.
International Search Report conducted in related application PCT/FR2015/050367, dated May 8, 2015.

* cited by examiner

METHOD FOR DETECTING A SHORT CIRCUIT IN A SYNCHRONOUS MACHINE FITTED WITH AN ANGULAR POSITION SENSOR

CROSS REFERENCE TO RELATED APPLICATION

This application is a national stage application of International PCT Application No. PCT/FR2015/050367, filed Feb. 16, 2015, which claims priority to, and the benefit of, French Application No. 1451456, filed Feb. 24, 2014, each of which is incorporated by reference herein in its entirety.

TECHNICAL DOMAIN

This invention refers to the general technical domain of angular position sensors and the general technical domain of synchronous machines comprising means of generating magnetic induction, and a position sensor of that type.

More particularly, this invention concerns a synchronous machine using sinusoidal electromotive force, comprising a position sensor to control the electric power supply of the said machine. Essentially, the invention is applicable in the field of synchronous machines powered by a multiphase AC voltage.

The invention will be described in greater detail in the following but in a non-limiting manner, with means of generating magnetic induction comprising, as an example, the use of permanent magnets.

A synchronous machine using permanent magnets comprises a wound stator and a rotor supporting permanent magnets. A machine of this type is supplied and driven by means of power electronics.

A synchronous machine using permanent magnets and sinusoidal electromotive force can be controlled by a vectorial control system. This type of control, known in its own right, allows high performance to be obtained, that is, high precision and high dynamic torque. This performance is necessary, in particular for traction motors.

A control system allowing high performance to be obtained, however, requires accurate knowledge of the angular position of the rotor in real time. Generally, the angular position of the rotor is given by a position sensor comprising in particular a rotating part mechanically linked with the rotor. There are different known technologies for determining the angular position of the rotor. For instance, we might refer to the position sensor known as the "resolver", the incremental digital encoder or the absolute encoder.

These known technologies however embody drawbacks. Indeed, the known position sensors all have a rotating part which is mechanically linked with the rotor. This is a major constraint affecting the design of the machine into which the position sensors are to be integrated. As a general rule, the rotating part of the angular position sensor is driven in rotation via a driving tube. As a general rule, such a driving tube passes through the stator and very often has high inertia which can make the measurement of the angular position slower. The lack of precision offered by a measurement of this type results in an alteration of the machine performance. In addition, the fact that it is necessary to pass through the machine to recover angular position information substantially increases the overall complexity. This means using a greater number of mechanical parts, increasing the risks of failure.

Furthermore, on the initial commissioning of a known synchronous machine, an operation known as calibration must be carried out by a converter. During this operation, the machine is rotating and the converter measures the angle corresponding to the electromotive force passing through zero. This calibration operation must be performed again for maintenance operations such as a change of sensor, a change of a rotor or stator or of an electromagnetic part or a change of the complete machine. A calibration operation like this is often difficult to perform, especially for long vehicles such as a railway vehicle since the said vehicles must be lifted to allow the free orientation of the wheels during calibration.

The calibration operation is however particularly important because an angular offset between the rotor measured angular position and its real position results in a large drop in torque. For instance, an offset of one mechanical degree causes a torque drop of approximately 5% and an offset of two mechanical degrees produces a torque drop of 20%.

The known synchronous machines may also embody failures due to short-circuiting between two phases. A failure such as this, interrupts or severely degrades the operation of the synchronous machine and repair is then inevitable.

DISCLOSURE OF THE INVENTION

The scope of this invention is, consequently, to propose a new process of detecting a short circuit between the phases of a synchronous machine.

Another goal of this invention is the implementing of such a detection method using a few simple, reliable and low cost means.

The goals assigned to the invention are achieved by a method of detecting a short circuit between the phases of a multiphase synchronous machine comprising a stator and a rotor, the said machine being equipped with at least one rotor angular position sensor, the stator comprising a winding designed to be supplied with current, the rotor comprising means of generating a magnetic induction, designed to move about the stator, the angular position sensor comprising at least two magnetic induction measuring sensors and at least one electronic unit, the fixed induction measuring sensors extending at the axial end of the rotor opposite to and immediately next to the axial edges of the means of generating magnetic induction, characterized in that it consists in:

i1) using the measured values and as delivered by the induction measurement sensors, i2) calculating the slope of the measured value curve as a function of time, i3) comparing the calculated slope to a threshold value, i4) if the calculated slope is equal to or greater than the threshold value, generating an alert signal via the electronic unit and otherwise, reverting to step i1).

According to an example of the implementation, the method conforming to the invention consists in repeating the steps i1) to i4) as a frequency included between 0 and 1000 Hz.

According to an example of the implementation, the method conforming to the invention consists in using the alert signal to interrupt the electric power supply of the synchronous machine.

According to an example of the implementation, the method conforming to the invention consists in using the alert signal to reconfigure the multiphase electric power supply of the synchronous machine.

According to another example of the implementation, the method conforming to the invention consists in using the alert signal to interrupt the electric power supply of the synchronous machine.

According to an example of the implementation, the method conforming to the invention the means for generating a magnetic induction used in the rotor consists of permanent magnets or electric windings.

According to an implementation example conforming to the invention, the method is applied to a vehicle wheel motor.

The synchronous machine in which the method conforming to the invention is implemented advantageously comprises the wheel motor of a railway or road-going vehicle.

The method conforming to the invention has the outstanding advantage of allowing detection by a rotor angular position sensor, of a possible short circuit between the two phases of the synchronous machine. No additional and specific detection system for determining a short circuit between phases is therefore necessary in a synchronous machine in which the method conforming to the invention is implemented.

BRIEF DESCRIPTION OF FIGURES

Other characteristics and advantages of the invention will also appear in drawings provided as non-limiting illustrations and in which.

DETAILED DESCRIPTION OF FIGURES

Figure 1:
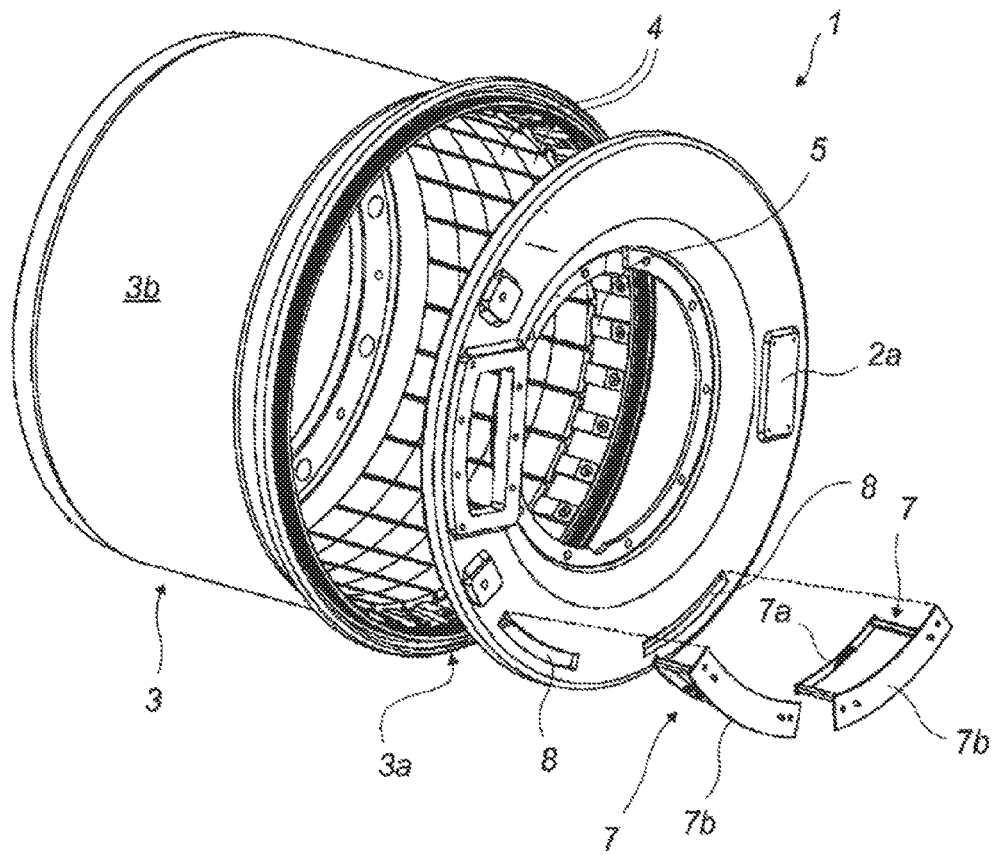
FIG. 1 illustrates an example of the embodiment of a synchronous machine implementing a method conforming to the invention.
Figure 4:
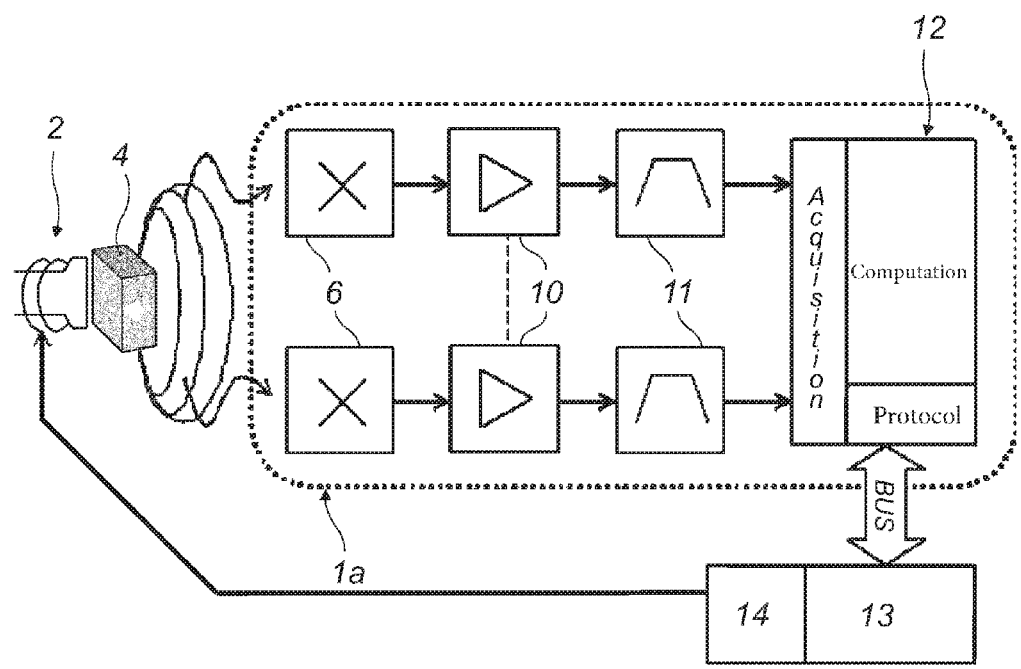
FIG. 4 illustrates a block diagram of the electronic means required to operate the angular position sensor of a synchronous machine and, accordingly, used to implement the method conforming to the invention.

FIG. 1 illustrates an example of the embodiment of a synchronous machine 1 comprising an angular position sensor mounted to a stator 2 illustrated schematically in FIG. 4. FIG. 1 shows part of the end 2a, for instance, in the form of a flange mechanically integral with the stator 2.

The synchronous machine 1 also includes a rotor 3 provided with permanent magnets 4.

The end part 2a covers at least partially, and without contact, an axial end 3a of the rotor 3. An example of the set-up between the axial end 3a and the end part 2a is illustrated in greater detail in FIG. 2.

The stator 2 comprises a winding, not shown, designed to be supplied with multiphase current by an electronic power device also known as a converter or inverter. Advantageously, the latter is supplied with voltage and current.

The rotor 3 advantageously has a substantially cylindrical shape 3b, the inner face of which is covered with permanent magnets 4. Rotor 3 is designed to rotate about the part of the stator 2 extending in the free space contained inside the said rotor 3.

The permanent magnets 4 are, for instance, stacked in an axial direction in the axial grooves made in the inside face of cylinder 3b. The assembly and attachment of the permanent magnets 4 to the inside face of the rotor 3 is done in a known manner.

For instance, the permanent magnets 4 are inserted by being slid into the axial grooves where they are held radially by the matching shapes of the said grooves and the said permanent magnets 4.

Figure 2:
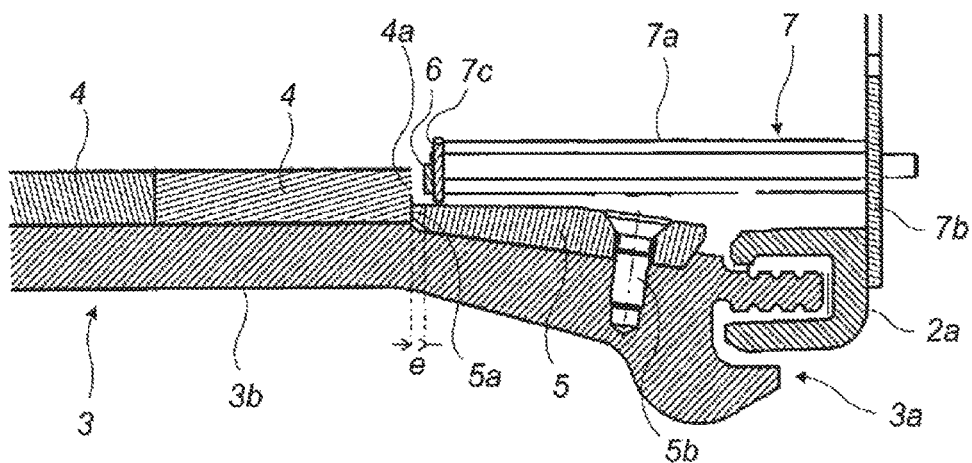
FIG. 2 shows a sectional detail view of FIG. 1.

Axially, the permanent magnets 4 are locked in each groove by means of a retaining part 5 of an magnetic material, illustrated in greater detail in the FIG. 2.

The retaining part 5 forms a stop 5a preventing the axial movement of the permanent magnets 4 engaged in the corresponding groove. The sizes and shapes of the retaining part 5 are chosen so as not to impede access to an area located opposite at least one part of axial edge 4a of the last permanent magnet 4 engaged in each groove.

The axial end 3a of the cylinder 3b, which does not have permanent magnets 4, advantageously comprises for the purpose a slightly hollowed-out shape in a radial direction. This shape limits the dimensions resulting from the attachment of the retaining part 5. Advantageously, a retaining part 5 is attached to the cylinder 3b, at the end of each groove by a screw 5b, thus actively locking all the rows of permanent magnets 4.

The synchronous machine 1 conforming to the invention also comprises an angular position sensor for rotor 3. In particular, the angular position sensor has magnetic induction measuring sensors 6. The latter are designed to detect the variation of the axial magnetic field generated by the permanent magnets 4. This variation of the axial magnetic field is detected and converted into voltage, supplied by the magnetic induction measurement sensors 6. Angular position sensor 1a also comprises at least one electronic unit designed to receive the induction voltages from the magnetic induction measurement sensors 6 and to deduce from them the angular position of rotor 3. This determination is carried out in an absolute manner. The electronic unit also allows real-time transmission of information relative to the angular position of rotor 3 to the electronic power device.

The magnetic induction measurement sensors 6 are mechanically integral with the end part 2a and extend at an axial end of rotor 3, opposite and immediately next to the axial edges 4a of the last permanent magnets 4 engaged in the grooves. When rotor 3 rotates, each axial edge 4a therefore passes in front of magnetic induction measurement sensors 6.

Advantageously, the magnetic measurement sensors 6 are attached to a removable support 7.

For this purpose, the removable support 7 has an axial support part 7a and a support end part 7b, The end part of the support 7b extends substantially transversely to the part of the axial support 7a. The magnetic induction measurement sensors 6 are arranged on an outer face 7c of the free end of the axial support part 7a.

The removable support 7 preferably forms a curve substantially matching the curve of the rotor 3. The magnetic induction measurement sensors 6 are advantageously attached and set out on an outer face 7c, on a line the curve of which substantially matches the curve of the succession of axial edges 4a of the permanent magnets 4.

The removable support 7 is, for instance, inserted into a slot 8 made in the end part 2*a*. Naturally, the slot 8 has a curve which is identical or similar to that in the part of the axial support 7*a*.

Once the removable support 7 is provided with the magnetic induction measurement sensors 6, it is axially inserted into the slot 8 until it abuts on the end part of support 7*h*, on the outer face of end part 2*a*. The dimensions of the removable support 7, and in particular the axial length of the axial support part 7*a* are chosen so that the magnetic induction measurement sensors 6 extend to a distance e from the axial edges 4*a*. The distance e is included for instance between 1.5 and 2.5 millimeters and preferably equal to 2 millimeters.

All types of attaching means, not shown, can also be used to make the end of support 7*b* integral with the end part 2*a*.

In one example of the embodiment, the synchronous machine 1 comprises at least three magnetic induction measurement sensors 6 arranged on a removable support 7.

In another example of the embodiment, the synchronous machine 1 conforming to the invention, illustrated in FIG. 1, comprises two removable supports 7 each of which is provided with, for instance, at least two magnetic induction measurement sensors 6.

Figure 3:
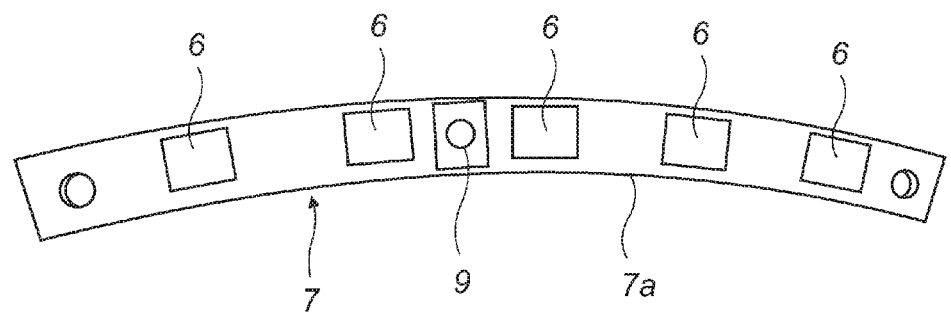
FIG. 3 is an example of the embodiment of a removable support for the angular position sensor, shown front-on, designed for insertion into a synchronous machine in which the method conforming to the invention is implemented.

FIG. 3 is a head-on illustration of an example of the embodiment of a removable support 7 comprising five magnetic induction measurement sensors 6. Accordingly, according to an example of the embodiment in FIG. 3, the synchronous machine 1 comprises two removable supports 7 each comprising five magnetic induction measurement sensors 6.

Advantageously, the outer face 7*c* of the axial support part 7*a* is provided with a temperature sensor 9. The latter is used for measuring the ambient temperature of the synchronous machine 1 in order to adjust its control because the induction depends on the temperature.

In a preferential example of the embodiment, the removable support 7 comprises at least one electronic circuit of the electronic unit or one part of the electronic circuit of the said electronic unit.

As an example, the electronic power device is a converter controlling the synchronous machine 1 by pulse width modulation.

The magnetic induction measurement sensors 6 are preferably Hall effect sensors. In another example of the embodiment of synchronous machine 1 conforming to the invention, the magnetic induction measurement sensors 6 consist of AMR/GMR sensors known as magnetoresistance sensors.

While the Hall effect sensors can be used for measuring the continuous component of the magnetic field, magnetoresistance sensors operate on the basis of the electrical resistance variation of a material depending on the direction of the magnetic field applied to it. These sensors are known in their own right and accordingly are not described any further.

By using Hall effect sensors or magnetoresistance sensors, the operation of calibrating the angular position sensor 1*a* is no longer necessary. Indeed, these sensors measure the spatial distribution of the magnetic field generated by the permanent magnets 4 even when the synchronous machine 1 is at a stop. This dispenses with the need for any calibration operation on the commissioning of the synchronous machine 1 or after a maintenance operation on the said synchronous machine 1. This represents an outstanding advantage for the synchronous machine 1 conforming to the invention.

FIG. 4 is a block diagram of the electronic means required for the operation of the angular position sensor 1*a* of synchronous machine 1 conforming to the invention. The latter therefore comprises the wound stator 2 and the rotor 3 comprising the permanent magnets 4.

The angular position sensor 1*a* therefore includes functional means which comprise induction measurement sensors 6, associated with the electronic unit for the acquisition of a signal and for calculating the positioning angle of the rotor 3. The functional means comprise, for instance, two magnetic induction measuring sensors 6, mounted in a fixed manner, without contact, and facing the permanent magnets 4. Information coming from these induction measuring sensors 6 is then amplified and filtered respectively by amplification means 10 and filtering means 11, before being acquired by a computer 12. This computer 12 of the electronic unit therefore determines a rotor angle (angular position of the rotor) from the information from the induction measuring sensors 6 and in real time transmits the rotor angle to a vectorial control system 13 which controls a converter 14.

The rotor angle is transmitted to the vectorial control system 13 via afield BUS type protocol such as SSI, PROFIBUS or another. In addition, the sign of the rotor angle determined by the computer 12 defines the direction of rotation of the synchronous machine 1.

Figure 5:
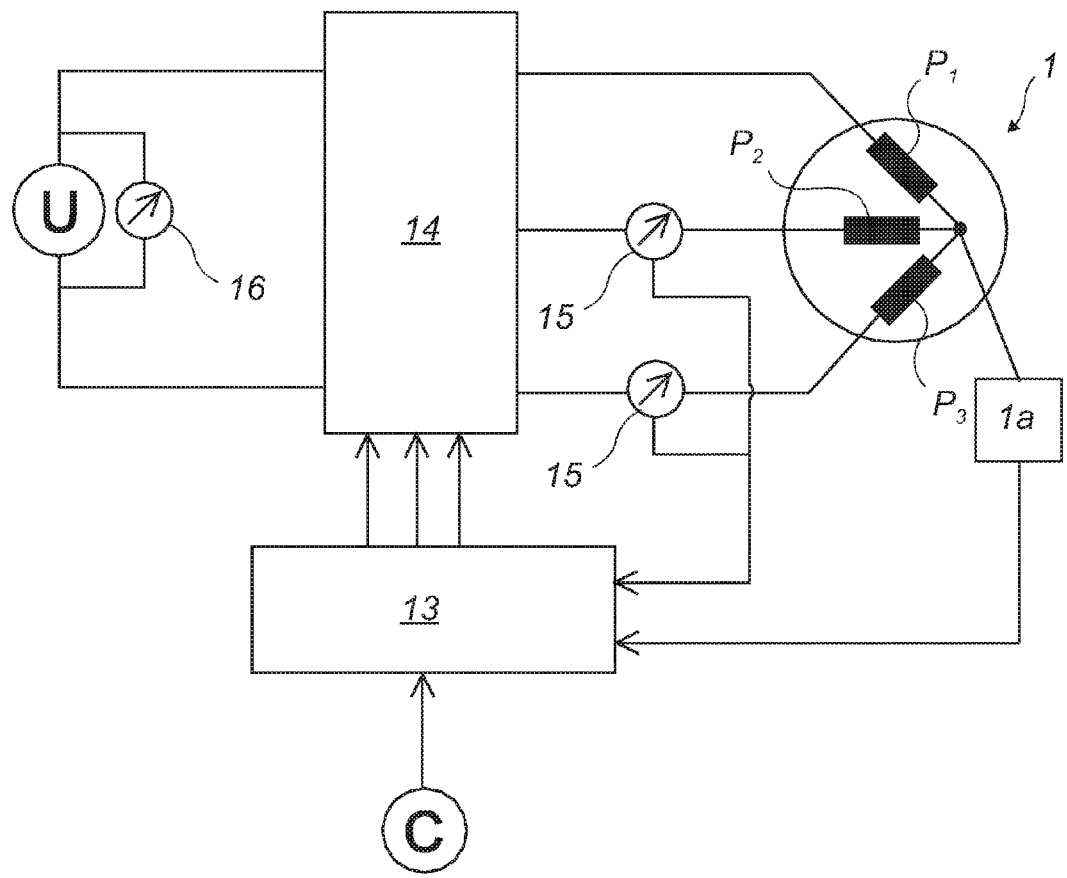
FIG. 5 illustrates, by means of a functional diagram, an example of the vectorial control system of a permanent magnet and sinusoidal electromotive force synchronous machine, in which the method conforming to the invention is implemented.

FIG. 5, by means of a functional diagram, illustrates the vectorial control system 13 of a synchronous machine 1 with permanent magnets 4 and sinusoidal electromotive force. In this example of a vectorial control system, the synchronous machine 1 includes the converter 14 supplied with electric voltage. The vectorial control system 13 controls the converter 14 by means of pulse width modulation PWM to generate a medium power supply voltage on each of the phases $P_1$, $P_2$, $P_3$ of synchronous machine 1 and thereby, determined current in each of the said phases $P_1$, $P_2$, $P_3$. The converter 14 therefore transforms the voltage supplied by a DC voltage source U into a three phase voltage supplying the synchronous machine 1. The latter operates, for instance, by traction and alternately as a three phase voltage generator when a vehicle is in the braking phase.

The vectorial control system 13 comprises a converter control unit 14, current sensors 15, a voltage sensor 16 and the angular position sensor 1*a* of the synchronous machine 1.

The vectorial control system 13 receives, for instance, the torque setpoint C. From the information derived from the current sensors 15, the angular position sensor 1*a* and from the setpoint C, the converter control unit 14 calculates the voltage vector to be applied to the said converter 14 so that the synchronous machine 1 reaches the torque setpoint C.

The vectorial control system 13, in particular the permanent magnet 4 and sinusoidal electromotive force synchronous machine 1, is known in its own right and will therefore not be described any further here.

The synchronous machine 1 conforming to the invention has the outstanding advantage of comprising an angular position sensor 1*a* capable of directly measuring the magnetic field produced by the permanent magnets 4 and thereby knowing how the magnetic field changes in the course of time. In this way, any deterioration of the performance of permanent magnets 4 can be detected, and thereby, so can the performance of the synchronous machine 1.

Furthermore, angular position sensor 1*a* of synchronous machine 1 is capable of detecting an abrupt increase in the induced magnetic field, resulting from short-circuiting between phases.

The synchronous machine 1 therefore allows the implementation of a process to detect short-circuiting between two phases conforming to the invention by means of a succession of steps explained in the following.

According to a first step i1), using the values B(t) measured and supplied by the induction measurement sensors 6, According to a second step i2), calculating at a given moment the slope dB(t)/dt (drifted with respect to time) of the measured value curve B(t) as a function of time.

According to a third step i3), comparing the calculated slope dB(t)/dt with a threshold value Vs.

Then, according to a fourth step i4), if the calculated slope dB(t)/dt is equal to or greater than the threshold value Vs, generating an alert signal S via the electronic unit and otherwise, reverting to step i1).

Advantageously, the method conforming to the invention consists in continuously repeating steps i1) to i4).

According to an example of the implementation of the detection method, the alert signal S is used to interrupt the electric power supply of the synchronous machine 1.

According to another example of the implementation of the detection method, the alert signal S is used to reconfigure the multiphase electric power supply of the synchronous machine 1.

Thanks to computer 12, the absolute angular position of rotor 3 and a short circuit can be determined jointly, in conformity with the procedure described above. The calculator 12 can therefore identify the phases of the synchronous machine 1 to be isolated to be identified and accordingly control the electric power supply of the said synchronous machine 1.

Permanent magnet 4 and sinusoidal electric force synchronous machine 1 comprises advantageously a wheel motor.

The synchronous machine conforming to the invention can also be used as a winch motor or an elevator motor.

It is obvious that this description is not confined to the examples explicitly described but also extends to other embodiments and/or implementation methods. Accordingly, a described characteristic may be replaced by an equivalent technical characteristic without moving out of the framework of the invention.

The invention claimed is:

1. A method of detecting a short circuit between phases of a multi-phase synchronous machine comprising a stator and a rotor using angular position sensors of the multi-phase synchronous machine, the synchronous machine being equipped with at least one angular position sensor, the stator comprising a winding configured to be supplied with current, the rotor comprising components that generate magnetic induction when moving about the stator, the angular position sensor comprising at least two magnetic induction measuring sensors and at least one electronic unit, the at least two magnetic induction measuring sensors being fixed and extending at the axial end of the rotor opposite to and immediately next to the axial end of the components that generates the magnetic induction, the method comprising:
   i1) retrieving values, by a processor, measured and supplied by the at least two magnetic induction measuring sensors of the angular position sensor fixed on the rotor;
   i2) calculating, by the processor, a change value of the measured values of the at least two magnetic induction measurement sensors as a function of time;
   i3) comparing, by the processor, the calculated change value to a threshold value configured to detect an abrupt increase in induced magnetic field as sensed by the at least two induction measuring sensor, wherein the threshold value is associated with a short circuit event between different phases; and
   i4) if the calculated change is equal to or greater than the threshold value, generating, by the processor, an alert signal via the electronic unit, or otherwise reverting to step i1).

2. The method according to claim 1, comprising continuously repeating the steps i1) to i4).

3. The method according to claim 1 comprising using the alert signal to interrupt an electric power supply of the synchronous machine.

4. The method according to claim 1 comprising using the alert signal to reconfigure a multi-phase electric power supply of the synchronous machine.

5. The method according to claim 1, wherein the components that generate the magnetic induction used in the rotor comprises permanent magnets.

6. The method of claim 5, wherein the at least two magnetic induction measuring sensors measure spatial distribution of the magnetic field generated by the permanent magnets even when the synchronous machine is at a stop.

7. The method of claim 6, wherein the at least two magnetic induction measuring sensors are mounted in a fixed manner, without contact, and facing the permanent magnets of the rotor.

8. The method of claim 5, wherein the at least two magnetic induction measuring sensors are configured to detect variation of axial magnetic field generated by the permanent magnets of the rotor.

9. The method according to claim 1 wherein the components that generate the magnetic induction used in the rotor comprises electric windings.

10. The method according to claim 1 wherein the synchronous machine is implemented within a vehicle wheel motor.

11. The method of claim 1, wherein each of the at least two induction measuring sensor is selected from the group consisting of a Hall effect sensor and magnetoresistance sensor.

12. The method of claim 1, wherein no additional and specific detection system for determining a short circuit between phases is used.

13. The method of claim 1, wherein the change of the measured value is a slope or a derivative with respect to time.

14. The method of claim 1, wherein the at least two magnetic induction measuring sensors are mechanically integral with the axial end of the rotor.

15. The method of claim 1, wherein the at least two magnetic induction measuring sensors are mechanically integral a removable support that forms the axial end of the rotor.

16. The method of claim 1, wherein absolute angular position values of the rotor and a short circuit condition are determined jointly by the processor.

17. The method of claim 1, wherein the change value is based on a change in measured magnetic field by the at least two magnetic induction measurement sensors.

18. A system comprising:
   a processor; and
   a memory having instructions stored thereon, wherein the instructions when executed by the processor, cause the processor to:
   determine a short circuit between phases of a multi-phase synchronous machine by:

i1) retrieving values measured and supplied by at least two magnetic induction measuring sensors of an angular position sensor fixed on a rotor of a multi-phase synchronous machine, wherein the multi-phase synchronous machine comprises a stator and the rotor, the stator comprising a winding configured to be supplied with current, wherein the rotor comprises components that generate magnetic induction when moving about the stator, wherein the angular position sensor comprises at least two magnetic induction measuring sensors, wherein the at least two magnetic induction measuring sensors is fixed and extending at the axial end of the rotor opposite to and immediately next to the axial end of the components that generates the magnetic induction;

i2) calculating a change value of the measured values of the at least two magnetic induction measurement sensors as a function of time;

i3) comparing the calculated change value to a threshold value configured to detect an abrupt increase in induced magnetic field as sensed by the at least two induction measuring sensor, wherein the threshold value is associated with a short circuit event between different phases; and i4) if the calculated change is equal to or greater than the threshold value, generating an alert signal via an electronic unit, or otherwise revert to step i1), wherein the absolute angular position values of the rotor and the short circuit condition are determined jointly by the processor based on the measurements supplied by the at least two magnetic induction measuring sensors of the angular position sensor.

\* \* \* \* \*